United States Patent [19]
Green, Jr.

[11] Patent Number: 5,146,175
[45] Date of Patent: Sep. 8, 1992

[54] COMBINING TECHNIQUE FOR A MULTISTAGE, PARALLEL AMPLIFIER

[75] Inventor: Donald R. Green, Jr., Spring Township, Berks County, Pa.

[73] Assignee: AT&T Bell Laboratories, Murray Hill, N.J.

[21] Appl. No.: 748,988

[22] Filed: Aug. 21, 1991

[51] Int. Cl.$^5$ ............................................. H03F 3/60
[52] U.S. Cl. ...................................... 330/54; 330/286
[58] Field of Search .................. 330/54, 277, 286, 295

[56] References Cited

U.S. PATENT DOCUMENTS 4,359,696 11/1982 Gerard ............................. 330/149 X
4,656,434 4/1987 Selin ........................................ 330/84

FOREIGN PATENT DOCUMENTS 54-141566 7/1979 Japan .

OTHER PUBLICATIONS

"A 2-8 GHz 2 Watt Monolithic Amplifier", J. Dormail, Y. Tajima, R. Mozzi, M. Durschlag, A. M. Morris, *IEEE Gallium Arsenide Integrated Circuit Symp. Tech. Dig.*, 1983, pp. 115-118.

Primary Examiner—James B. Mullins
Attorney, Agent, or Firm—S. W. McLellan

[57] ABSTRACT

A reduced loss coupling technique for combining multiple, parallel, gain-stages to form an amplifier. A first transmission line, with multiple taps, couples the inputs of the gain-stages together and to an input port for the amplifier. A second transmission line, also with multiple taps, couples the outputs of the gain-stages together and to an ouput port for the amplifier. Preferably, the output port is connected to the end of the second transmission line while the input port is connected asymmetrically (off center) along the first transmission line. The actual position of the input port along the first transmission line is determined by the desired amount of phase mismatch of between signal paths through all of the gain-stages as measured from the input port to the output port.

12 Claims, 2 Drawing Sheets

1

COMBINING TECHNIQUE FOR A MULTISTAGE, PARALLEL AMPLIFIER

BACKGROUND OF THE INVENTION

1. Field of the Invention

This invention relates to amplifiers in general and, more particularly, to power microwave amplifiers.

2. Description of the Prior Art

Solid-state microwave power amplifiers have been traditionally limited to low power applications, particularly at high microwave frequencies, such as X band (approximately 12 GHz) and above. For more output power than a few watts, traveling wave tubes (TWTs) are predominately used at these frequencies. In certain applications, such as in aircraft or satellites, TWTs may not be suitable because of size, excess weight, and high power consumption (low efficiency). Hence, it is preferable that the power amplifier be of a solid-state variety since they are inherently smaller, have less weight, and have higher efficiency than TWTs—up to certain power levels and frequencies. When, for example, an X band amplifier is needed that can provide more than five watts, existing solid-state technologies are pushed to, or beyond, their limits.

Gallium arsenide technology is the most practical of existing solid-state device technologies for microwave power amplifiers. Other technologies, such as silicon or indium phosphide, are either too inefficient at microwave frequencies or not sufficiently developed for commercial manufacture. Active gallium arsenide microwave devices are basically of two types: heterojunction field-effect transistors (HFETs) or recessed gate junction field-effect transistors (JFET); heterojunction bipolar transistor (HBT) technology is, as yet, too immature for microwave power amplifier applications. However, individual HFET or JFET devices can only provide several hundred milliwatts, not watts, at X band frequencies. Hence, a technique of coupling the devices together must used to achieve the desired output power.

To achieve the desired output power from solid-state (HFET or JFET) amplifiers, it is desirable that the signals from the individual amplifiers (gain-stages) be combined such that the power from each is added together with minimal loss. One such technique involves hybrid combiners which split the signal to be amplified into multiple outputs which, in turn, couple to the corresponding inputs of the gain-stages. The outputs from the stages are then recombined in another hybrid and the output thereof has the amplified signal thereon. It is critical, however, to make sure that the signal paths through the hybrids and individual amplifier stages have substantially the same delay or phase shift, otherwise the overall gain (or efficiency) of the hybrids/gain-stage combination will be degraded. A somewhat complicated technique which helps compensate for phase-shift mismatch is shown in U.S. Pat. No. 4,656,434. Hybrids are typically large and may have undesirable weight, making compact amplifiers impractical.

Another technique for combining individual gain-stages into an amplifier is to parallel the gain-stages by "brute force". This involves directly paralleling the stages (usually individual transistors) until the desired output power is achieved. This technique is especially advantageous when combined with integrated circuit fabrication technologies to fabricate several transistors in a common substrate. The "brute force" technique is utilized to some extent, as will be discussed below.

However, as frequencies increase, the physical size (equivalent to delay, discussed below) in the circuitry used to interconnect the transistors (typically transmission lines) becomes a significant fraction of the wavelength of the signal to be amplified. At high microwave frequencies, such as X band frequencies, the amplified signals from each transistor (gain-stage) may be significantly mismatched in phase, measured at the output of the amplifier, leading to excessive loss when combined. This lowers the overall efficiency of the amplifier, possibly rendering the amplifier unsuitable as a power amplifier. For example, for an eight gain-stage amplifier operating at 12 GHz, similar to that disclosed in FIG. 1 of Japanese patent 54-141566, and shown in simplified form in FIG. 3, the combining loss (ignoring losses in the metal interconnect which forms a transmission line) is estimated to be about 0.03 dB. Similarly, the combining loss for an eight stage amplifier, similar to that disclosed in FIG. 2 of the above-identified Japanese patent, and shown in simplified form in FIG. 4, is estimated to be about 0.1 dB. The above examples, and the method of calculating the losses therein, will be described in more detail below.

SUMMARY OF THE INVENTION

Therefore, it is desirable to have a technique for combining individual amplifiers (gain-stages) in an amplifier with reduced combining loss as to achieve high efficiency without undue sacrifice of size, weight, or cost.

Further, it is desirable to provide a readily integratable structure which allows for efficient combining of gain-stages to achieve efficient amplifiers at high microwave frequencies.

These and other aspects of the invention may be obtained generally in an amplifier having an input and an output port and having a plurality of parallel gain-stages interconnected with first and second transmission lines. The amplifier is characterized by the input port of the amplifier connecting to a point along the first transmission line and the output port of the amplifier connecting to a point along the second transmission line, at least one of the ports being disposed asymmetrically along its corresponding transmission line and at least one of the ports connecting to its corresponding transmission line between the ends thereof. The points of connection for the input and output ports are chosen to provide a predetermined phase mismatch between signal paths through all of the plurality of gain-stages as measured from the input port to the output port.

BRIEF DESCRIPTION OF THE DRAWING

The foregoing features of this invention, as well as the invention itself, may be more fully understood from the following detailed description of the drawings, in which.

DETAILED DESCRIPTION

Before discussing the invention, a brief background discussion is presented herein for better understanding of the invention. It is recognized that the delay of a signal, for example by the propagation of the signal through a transmission line, results in a relative phase shift in the signal. When combining signals of the same frequency, the signals should have substantially the same phase so that the signals constructively add together; phase mismatches between the signals proportionally decrease the resulting combined signal's power. Because of the duality between delay and phase shift, as well as the dependence of phase shift on frequency, delay and phase shift requirements are used interchangeably herein. Typically, a transmission line is referred to as having a certain delay, while signals are referred to as having a phase shift.

The delay through a transmission line varies with the physical dimensions of the line as well as the loading thereon. For example, it is well understood in the art how the length, width and dielectric material affect the impedance, as well as the propagation delay, of a stripline transmission line. Further, the propagation delay is substantially affected by periodic loading of the transmission line with shunt impedances, such as that from the input and outputs of amplifiers and/or lumped impedances, at intervals substantially shorter than the wavelength of a signal propagating therein. The approximate delay, $\tau$, may then be calculated from $\sqrt{LC}$, where L is the inductance transmission line interval and C is the capacitance of the transmission line interval plus the periodic shunt capacitive loading on the line. Still further, if the transmission line is substantially longer than a wavelength, the ends of the transmission line may be terminated with dissipative impedances to suppress reflections.

It may also be desirable to size the transmission lines according to the power thereon. For example, the transmission line carrying the output power from the power amplifier may be larger (typically wider in case of stripline transmission lines) to carry the amplified signal without excessive loss.

Figure 1:
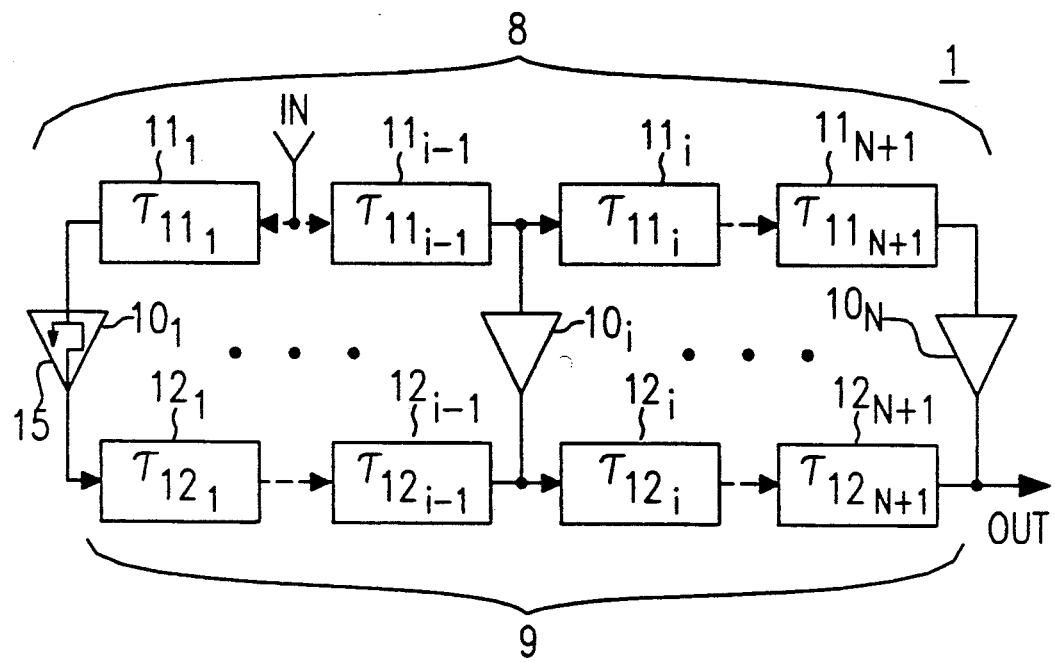
FIG. 1 is a simplified schematic diagram of a generalized exemplary embodiment of the invention.

In FIG. 1, an exemplary arrangement for efficiently combining a plurality of gain-stages into an amplifier 1, such as a power amplifier, is shown. Here, a first transmission line 8 and a second transmission line 9, couple together a plurality of gain-stages $10_1-10_N$ in parallel. The input port of the amplifier 1, and the output port of the amplifier 1, connect to corresponding first and second transmission lines 8, 9 such that the mismatch between the delay of the signal path through each of the gain-stages $10_1-10_N$ is a predetermined amount. One or both of the input and output ports asymmetrically connect along its corresponding transmission line 8, 9 (not connected in the center thereof) and at least one of the input or output ports connects to the corresponding transmission line 8, 9 between the ends thereof, i.e., not at the ends thereof. As shown in FIG. 1, the output port OUT is connected to the end of transmission line 9 while the input port IN is connected asymmetrically along transmission line 8. It is understood that the input port IN may be connected to the end of line 8 and the output port OUT connected asymmetrically along the transmission line 9 as shown in FIG. 2.

Alternatively, the amplifier 1 may be viewed as having a first and second plurality of serially coupled transmission lines $11_1-11_{N+1}$, $12_1-12_{N+1}$, (being subsections or intervals of corresponding transmission lines 8, 9) having corresponding delays $\tau_{111}-\tau_{11n+1}$, $\tau_{121}-\tau_{12N+1}$, coupling together a plurality of gain-stages $10_1-10_N$ in parallel.

Figure 2:
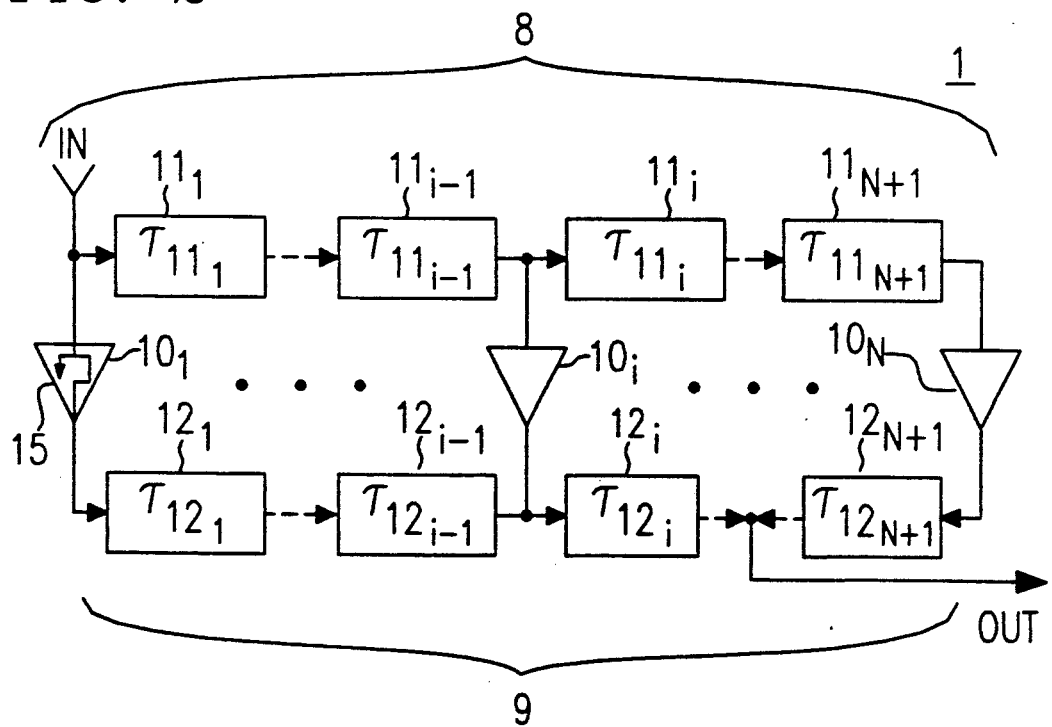
FIG. 2 is a simplified schematic diagram of another generalized exemplary embodiment of the invention.

An exemplary gain-stage $10_1$ is shown in FIGS. 1, 2 as having at least one field effect transistor 15. The gate of the FET 15 is the input of the stage $10_1$ and the drain of the FET 15 is the output of the stage $10_1$. The source of FET 15 is shown grounded. All gain-stages $10_1-10_N$ may be integrated onto a common substrate or be separate devices. Other circuits may be used for the gain-stages $10_1-10_N$, such as monolithic microwave integrated circuit gain blocks. In any case, it is preferable that the delay through each of the stages $10_1-10_N$ be substantially the same.

A calculation of the combining losses due to phase mismatching is straight forward and ignores losses from the transmission lines 8, 9. The calculation also ignores coupling losses between the transmission lines 8, 9 and the gain-stages $10_1-10_N$. The coupling loss is calculated by first determining the phase shift of a signal at the frequency of interest, applied to the input port and measured at the output port of the amplifier 1, through each gain-stage $10_1-10_N$ individually. Then the "amplified" signals are added vectorially to yield a resulting sum. The magnitude of the sum is compared to the maximum possible sum magnitude (where there is no phase difference between the individually "amplified" signals). The difference in magnitude is the loss due the particular combining arrangement used. Calculation of exemplary losses for the prior art embodiments and for the exemplary embodiment of the invention (FIG. 1) will be given below. It is noted, however, that the loss analysis can easily be extended by anyone skilled in the art to include transmission line losses as well as coupling effects.

The transmission lines 8, 9 (FIGS. 1, 2) are preferably stripline, microstrip, or coplanar transmission lines, formed onto a common substrate, such as a semiconductor, ceramic, or polyimid substrate. The transmission lines 8, 9 (FIGS. 1, 2) may be fabricated on the same substrate as the gain stages. The impedance of the input and output ports coupled to corresponding transmission lines 8, 9 are preferably matched to standard impedances (e.g., 50 ohms), by conventional impedance transformation networks (not shown). The impedance transformation networks may be placed on the same substrate as the transmission lines 8, 9. The gain-stages $10_1-10_N$ may then be formed on, or added to, a common substrate with the transmission lines 8, 9.

EXAMPLE

The combining losses calculated below for the examples given below are for an eight stage amplifier (N=8). In addition, the corresponding delay of the transmission lines 8, 9 are the same in each example, here about five nanoseconds ($\tau_1$, $\tau_{111}-\tau_{11N+1}$) between taps on transmission line 8 and about one nanosecond ($\tau_2$, $\tau_{121}-\tau_{12N+1}$) between taps on transmission line 9. The difference in delays results from the different input and output impedances of the gain stages $10_1-10_8$ affecting the propagation delay, as described above. Further the size of the transmission line 9 is made larger to accommodate the higher power thereon. The delays between taps on the transmission lines 8, 9 are preferably substantially the same. However, the delays may be different between taps to accommodate different design criteria such as physical layout, etc.

Figure 3:
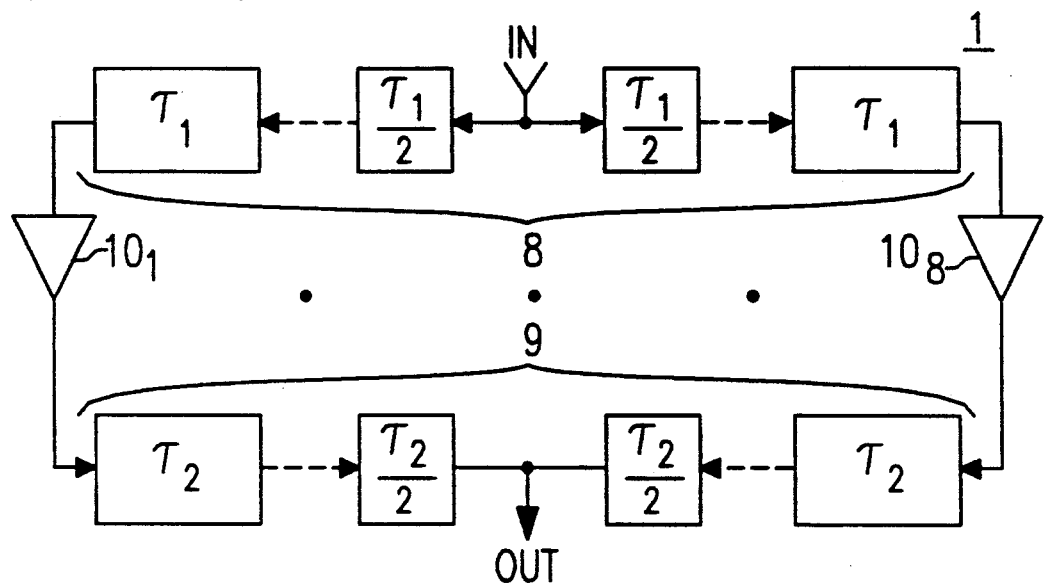
FIG. 3 is a simplified schematic diagram of an amplifier utilizing a prior art combining technique; and, FIG. 4 is a simplified schematic diagram of an amplifier utilizing another prior art combining technique.
Figure 4:
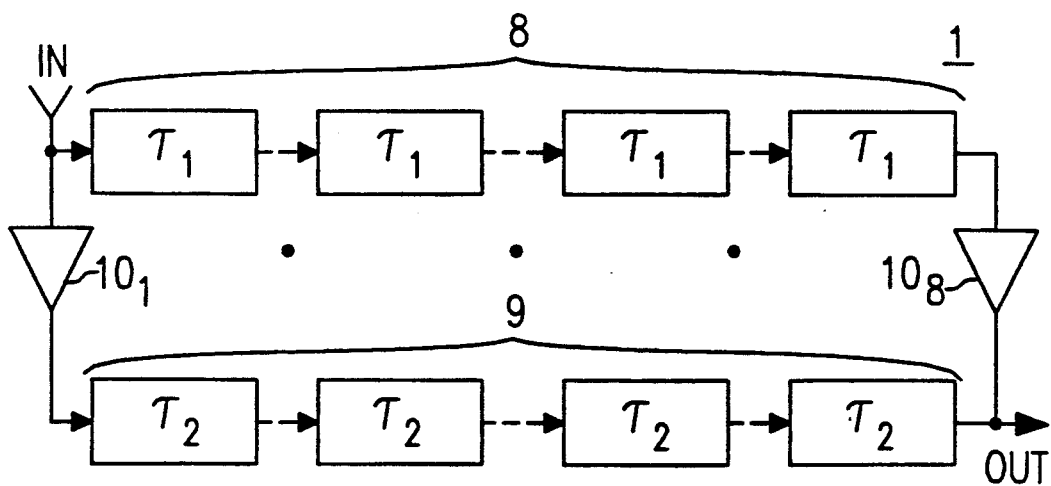

For example, using symmetrical connections for the input and output ports (the input and output ports couple to the center of the transmission lines 8, 9 as that shown in FIG. 3 and discussed above), the coupling loss for an eight gain-stage amplifier 1 is about 0.05 dB at X band frequencies. For the amplifier 1 shown in FIG. 4, using input and output ports coupled to the ends of the corresponding transmission lines, the coupling loss is about 0.02 dB.

An exemplary eight gain-stage ($N=8$) power amplifier 1 as shown in FIG. 1 and in accordance with one embodiment of the invention, has significantly less combining loss than said prior art embodiments. In this example, the input port couples to the tap along the transmission line 8 where the third gain-stage ($10_3$, not shown) couples thereto. The resulting combining loss is calculated to be about 0.01 dB, less than calculated for the prior art embodiments shown in FIGS. 2 and 3, discussed above.

Having described the preferred embodiment of this invention, it will now be apparent to one of skill in the art that other embodiments incorporating its concept may be used. Therefore, this invention should not be limited to the disclosed embodiment, but rather should be limited only by the spirit and scope of the appended claims.

I claim:

1. An amplifier having an input port and an output port and having a plurality of parallel gain-stages interconnected with first and second transmission lines; characterized by:
   the input port of the amplifier connecting to a point along the first transmission line and the output port of the amplifier connecting to a point along the second transmission line, at least one of the ports being disposed asymmetrically along its corresponding transmission line and at least one of the ports connecting to its corresponding transmission line between the ends thereof;
   wherein the points of connection for the input and output ports are chosen to provide a predetermined phase mismatch between signal paths through all of the plurality of gain-stages as measured from the input port to the output port.

2. The amplifier as recited in claim 1, wherein the delay through each of the plurality of gain-stages is substantially the same.

3. The amplifier as recited in claim 2, wherein the gain-stages are connected to the transmission lines such that the delay between connections are substantially the same.

4. The amplifier as recited in claim 3, wherein the output port is connected to an end of its corresponding transmission line.

5. The amplifier as recited in claim 3, wherein each of the gain-stages has a transistor.

6. The amplifier as recited in claim 3, wherein the input port is connected to an end of its corresponding transmission line.

7. An amplifier having;
   first and second pluralities of series-coupled transmission lines;
   an input port coupled to a point along the first plurality of transmission lines;
   an output port coupled to a point along the second plurality of transmission lines; and
   a plurality of parallel gain-stages interconnected with the first and second pluralities of series-coupled transmission lines;
   characterized by:
   at least one of the ports being disposed asymmetrically along its corresponding plurality of transmission lines and at least one of the ports connecting to its corresponding plurality of transmission lines between the ends thereof;
   wherein the connection to the first and second transmission lines by the input and output ports is chosen to provide a predetermined phase mismatch between signal paths through all of the plurality of gain-stages as measured from the input port to the output port.

8. The amplifier as recited in claim 7, wherein the delay through each of the plurality of gain-stages is substantially the same.

9. The amplifier as recited in claim 8, wherein the plurality of gain-stages are connected to the transmission lines such that the delay between connections are substantially the same.

10. The amplifier as recited in claim 9, wherein the output port is connected to an end of its corresponding transmission line.

11. The amplifier as recited in claim 10, wherein each of the gain-stages has a transistor.

12. The amplifier as recited in claim 9, wherein the input port is connected to an end of its corresponding transmission line.

* * * * *